United States Patent

Canada et al.

[11] Patent Number: 6,124,692
[45] Date of Patent: Sep. 26, 2000

[54] METHOD AND APPARATUS FOR REDUCING ELECTRICAL POWER CONSUMPTION IN A MACHINE MONITOR

[75] Inventors: Ronald G. Canada, Knoxville; Eugene F. Pardue, Lenoir City; James C. Robinson; Paul Z. D. Wolfensberger, both of Knoxville; William E. Childress, Norris, all of Tenn.

[73] Assignee: CSI Technology, Inc., Del.

[21] Appl. No.: 09/072,379

[22] Filed: May 4, 1998

Related U.S. Application Data

[63] Continuation-in-part of application No. 08/915,069, Aug. 20, 1997, Pat. No. 5,852,351, which is a continuation-in-part of application No. 08/697,335, Aug. 22, 1996, Pat. No. 5,726,911.

[51] Int. Cl.[7] .................................................. G01R 31/02
[52] U.S. Cl. ............................................ 318/490; 388/909
[58] Field of Search ................................... 318/565, 490; 388/909

[56] References Cited

U.S. PATENT DOCUMENTS

| | | | |
|---|---|---|---|
| 4,194,178 | 3/1980 | Dumbeck | 340/201 |
| 4,258,421 | 3/1981 | Juhasz et al. | 364/424 |
| 4,495,448 | 1/1985 | Dumbeck | 318/54 |
| 4,520,674 | 6/1985 | Canada et al. | 73/660 |
| 4,525,763 | 6/1985 | Hardy et al. | 361/24 |
| 4,575,803 | 3/1986 | Moore | 364/551 |
| 4,659,976 | 4/1987 | Johnson | 318/332 |
| 4,823,067 | 4/1989 | Weber | 318/799 |
| 4,839,830 | 6/1989 | Amey et al. | 364/551.01 |
| 5,019,760 | 5/1991 | Chu et al. | 318/490 |
| 5,189,350 | 2/1993 | Mallett | 318/473 |
| 5,323,325 | 6/1994 | Izumiya | 364/474.16 |
| 5,450,321 | 9/1995 | Crane | 364/424.04 |
| 5,473,229 | 12/1995 | Archer et al. | 318/254 |
| 5,534,759 | 7/1996 | Evans et al. | 318/139 |
| 5,554,900 | 9/1996 | Pop, Sr. | 310/156 |
| 5,617,572 | 4/1997 | Pearce et al. | 395/750 |
| 5,633,811 | 5/1997 | Canada et al. | 364/576 |
| 5,850,351 | 12/1998 | Lotfy et al. | 364/492 |

*Primary Examiner*—Bentsu Ro
*Attorney, Agent, or Firm*—Luedeka, Neely & Graham, P.C.

[57] ABSTRACT

Power saving features are employed in a machine monitor to reduce electrical power consumption and increase the life of an electrical power source (such as a battery) which is used to power the monitor. The monitor includes a microcomputer having a high operating speed and a low operating speed. Power consumption is reduced by placing the microprocessor in a low-power sleep mode when full power capabilities of the microprocessor are not needed. Power consumption is further reduced by operating the microprocessor at the low operating speed when a high operating speed is not needed. The monitor also includes a communications port in electrical communication with the microcomputer for communicating with a peripheral device, and sensors for sensing machine characteristics such as speed, temperature, flux, or vibration. Power switches are employed to remove electrical power from portions of the monitor electronics that are not being used or are not needed, and a DC/DC converter maximizes the amount of electrical power available for use by the monitor electronics. Power consumption is further reduced by the manner in which the monitor processes vibration signals to compute machine speed.

33 Claims, 6 Drawing Sheets

METHOD AND APPARATUS FOR REDUCING ELECTRICAL POWER CONSUMPTION IN A MACHINE MONITOR

This is a continuation-in-part of application Ser. No. 08/915,069, filed Aug. 20, 1997, now U.S. Pat. No. 5,852,351, which is a continuation-in-part of application Ser. No. 08/697,335, filed Aug. 22, 1996, now U.S. Pat. No. 5,726,911.

TECHNICAL FIELD

The present invention relates generally to reduction of electrical power consumption in electronic devices. More particularly, the invention relates to a circuit and method for reducing electrical power consumption and increasing battery life in a machine monitor.

BACKGROUND

In typical industrial and manufacturing facilities, various types of machinery are employed at various stages of the production process. Such machines generally function to provide the power and moving forces necessary to achieve the end product or process. From a production viewpoint, it is desirable to maintain the machinery in good operating condition to avoid unproductive downtime and profit loss when a machine experiences a failure condition. Therefore, a typical plant maintenance program will involve activities for monitoring the operating condition of plant machinery so that the health and condition of the machines can be maintained at high levels to reduce the number of unexpected machine failures.

Portable instruments are often employed to periodically monitor various operating conditions of industrial machinery. These portable instruments, which are often referred to as data collectors or data analyzers, typically include a vibration transducer attached to what is essentially a hand-held computer. The maintenance technician places the vibration transducer against a predefined test point of the machine. The resultant machine vibration signal produced by the transducer is provided to the data collector where the data is processed and stored for later downloading to a host computer. The host computer then analyzes the vibration data for faults or other anomalous conditions.

Machines within a facility are typically monitored according to a route which is programmed into the data collector by the host computer. The route will typically include a list of machines, test points, and a set-up condition for each test point. There may be as many as thirty or more machines in the route with ten test points on each machine, and for each test point there may be specified a vibration frequency range to be analyzed, a type of analysis to be performed, a particular type or set of data to be stored, and similar other parameters. In response to commands from the user, the hand held instrument prompts the user for the identity of the machine and the test point to be monitored, and it automatically sets up the instrument, for example, to accept the specified frequency range for the test point, perform the specified analysis and store the specified type or set of data. A Fast Fourier Transform analysis may be performed on a pre-selected frequency range of the data and all or part of the resulting frequency spectrum may be stored and displayed. As the user progresses through the thirty machines and the corresponding 300 test points, he collects and stores vibration data which is subsequently transferred to the host computer for long term storage and further analysis.

The present invention provides a completely new approach to machine monitoring. Instead of manually collecting machine data with a portable device of the type described above, this invention contemplates a machine monitor which is attached directly to the machine or at some point sufficiently proximate the machine to enable the monitor to sense a machine operating characteristic. The monitor includes the electronics and sensors necessary to sense, analyze, and store one or more of the machine's operating characteristics, including vibration, temperature, and flux. Since the monitor and the machine to which it is attached are often located in harsh industrial environments, the monitor's electronics and sensors should be adequately protected from mechanical shock, thermal shock, moisture, oil, dirt, and other environmental elements in order to function reliably over extended periods of time. Moreover, maintenance considerations for such machine monitors dictate that the monitor should be easy to install and replace, and that the monitor's electronics, sensors, and batteries be easily accessed. Provisions should also be incorporated into the monitor to enable maintenance personnel to easily download machine data stored by the monitor and to upload new programming to the monitor when needed.

Another desirable aspect for machine monitors which are powered by internal batteries is low electrical power consumption to enable monitoring of the machine for prolonged periods of time. If the power source for the monitor is quickly depleted, important machine operating data such as temperature, speed, flux, and vibration may be lost and the monitor will be unable to determine the operating condition of the machine. Thus, it is desirable to incorporate into battery-powered machine monitors power saving features such as disabling circuitry within the monitor when the circuitry is not needed for data readings, powering only elements of the monitor which process data readings, and operating the monitor electronics at low clock speeds when possible.

SUMMARY

The present invention overcomes the above difficulties and disadvantages of the prior art by providing a monitor having a structural enclosure that attaches to a machine. The monitor includes a power source disposed in the enclosure for supplying electrical power to the monitor. At least one sensor disposed in the enclosure senses one or more operating characteristics of the machine and produces sensor signals corresponding to the sensed characteristic. A microcomputer having a low-power operating mode and a high-power operating mode receives and processes the sensor signals to produce sensor data. To reduce electrical power consumption in the monitor, the microcomputer is programmed to operate in the low-power operating mode when high-power operation is not needed. Memory is provided for storing sensor data, and a communications port (such as a wireless communications port) enables the monitor to communicate with a peripheral device.

Various additional features may be included in the monitor to reduce electrical power consumption in the monitor. One such feature is the use of power switches controllable by the microcomputer to remove electrical power from portions of the monitor electronics which are not in use or are not needed. For example, a power switch interconnecting the power source and sensor and being controllable by the microcomputer may be used to remove electrical power from the sensor when the sensor is not in use. As another example, the monitor may further include a signal conditioning circuit for receiving and processing sensor signals to produce processed signals. In this embodiment, a power switch interconnecting the power source and signal conditioning circuit is used to remove electrical power from the signal conditioning circuit when the signal conditioning circuit is not in use. As yet another example, the monitor may further include a frequency filter circuit for filtering the processed sensor signals to remove unwanted frequency components. A power switch is employed to remove electrical power from the frequency filter circuit when the frequency filter circuit is not in use.

The monitor may also include a DC/DC converter connected to the power source to increase the amount of useable electrical power stored by the power source. If desired, an undervoltage protection circuit in electrical communication with the microcomputer and the DC/DC converter may be provided for resetting the microcomputer and placing the microcomputer in the low-speed operating mode when the undervoltage protection circuit detects that electrical power supplied to the DC/DC converter has dropped below a threshold level.

The invention also provides an apparatus for reducing electrical power consumption in a machine monitor. In this aspect of the invention, the apparatus includes a microcomputer having a high-speed operating mode and a low-speed operating mode. A fast clock produces a high frequency clock signal to operate the microcomputer in the high-speed mode, and a slow clock is used to produce a low frequency clock signal to operate the microcomputer in the low-speed mode. A communications port in electrical communication with the microcomputer enables the monitor to communicate with a peripheral device. At least one sensor is employed for sensing an operating characteristic of the machine and producing sensor signals corresponding to the machine operating characteristic that is sensed. A power source supplies the monitor with electrical power. Additionally, the microcomputer is operable to remove electrical power from at least the communications port when the communications port is not in use. The monitor may also be configured to incorporate the power saving features described above.

The "at least one sensor" described above may include a flux sensor for sensing flux generated by the machine and producing a corresponding flux signal. When the apparatus is configured in this manner, a frequency filter is used to remove all frequency components from the flux signal except those frequency components in a range from about 0–60 Hertz with the microcomputer being operable to transform the filtered flux signal from the time domain to the frequency domain to produce a flux spectrum which includes a first line frequency peak. A power switch may be also be included to remove electrical power from the frequency filter when the frequency filter is not in use.

The present invention also provides a monitor that attaches to a machine and includes a structural enclosure, means for attaching the enclosure to the machine, and a power source disposed in the enclosure for supplying dc electrical power to the monitor. A sensor disposed in the enclosure senses an operating characteristic of the machine and produces corresponding sensor signals. A microcomputer disposed in the enclosure receives and processes the sensor signals to produce sensor data. The microcomputer includes a sleep mode for operation at a significantly reduced power level when full power operation is not required. Memory is provided for storing sensor data, a communications port is used to communicate with a peripheral device.

The invention also provides a method for reducing electrical power consumption in a machine monitor. The method includes the steps of providing a machine monitor having monitor electronics including a microcomputer which can operate in a high-power operating mode and a low-power operating mode, and a communications port in electrical communication with the microcomputer for communicating with a peripheral device. The microcomputer is programmed to operate in the low-speed operating mode when high-speed operation is not needed.

The method may further include the steps of placing the communications port in an operational state by applying electrical power to the communications port, placing the microcomputer in the high-power operating mode, halting operation of the microcomputer for a predetermined period of time as the microcomputer determines whether a peripheral device is attempting to communicate with the microcomputer, and establishing high-power communication between the communications port and a peripheral device when the microcomputer determines that the peripheral device is attempting to communicate with the microcomputer. If the microcomputer determines that no peripheral device is attempting to communicate with the microcomputer, the microcomputer is placed in the low-power operating mode.

BRIEF DESCRIPTION OF THE DRAWINGS

The above and other features, aspects and advantages of the present invention will now be discussed in the following detailed description and appended claims considered in conjunction with the accompanying drawings in which:

DETAILED DESCRIPTION OF PREFERRED EMBODIMENTS

Figure 1:
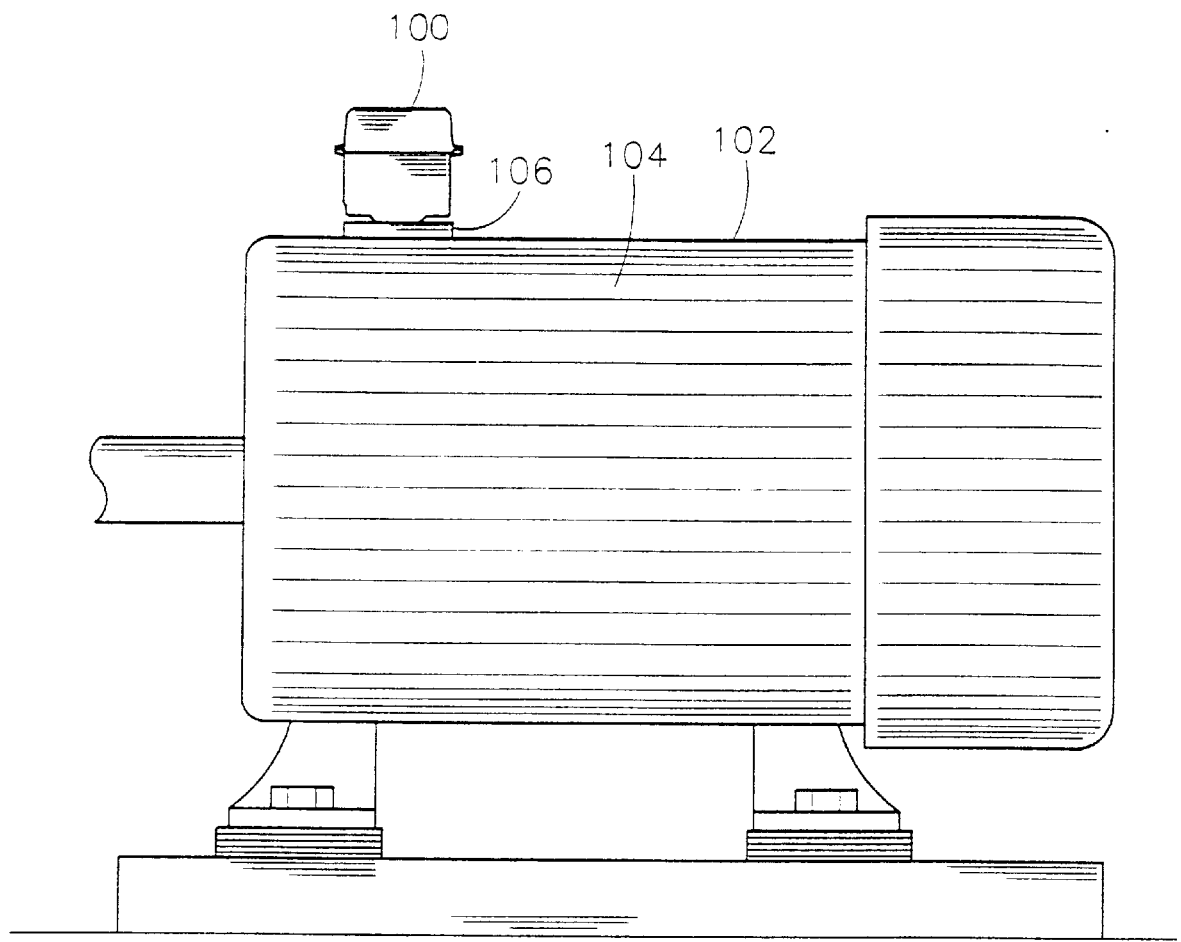
FIG. 1 is a side view of an ac induction motor with a monitor of the present invention attached to the motor by means of a mounting plate.

In accordance with a preferred embodiment of the present invention shown in FIG. 1, a motor monitor 100 capable of sensing, analyzing, storing, and outputting various motor operating data is attached externally to the frame 104 of a large industrial electrical machine, such as an ac induction motor 102. Alternately, the monitor 100 may be attached to an ac generator for sensing and recording various life history parameters of the generator. The monitor 100, which is fully self-contained in sensors, data acquisition, and power, is small in comparison to the size of the motor 102 and mounted so as not to interfere with the operation of the motor 102. Although FIG. 1 illustrates a monitor 100 mounted at a particular location on the motor frame 104, it will be understood that the monitor 100 may be mounted at any location on, near, or otherwise proximate the motor frame 104 where motor parameters, such as temperature, vibration, and flux, may be sensed.

Figure 2:
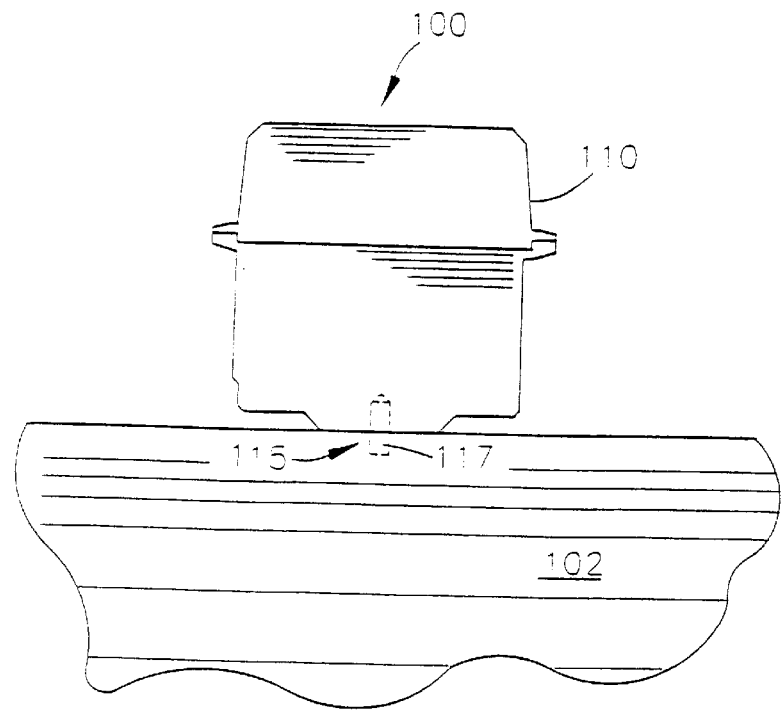
FIG. 2 is a sectional view of an electric motor monitor attached to an electric motor by means of a bolt threaded into the lifting eye bolt hole of the motor.

In order to provide consistent, reliable motor operating data, the monitor 100 should be capable of withstanding the environmental conditions typically experienced by an electric motor 102, including mechanical shock, temperature, and contamination from such materials as oil and water. As shown in FIG. 2, the monitor 100 consists of a ruggedized housing 110 capable of withstanding the typically harsh environments of industrial facilities. Electronics and sensors within the monitor 100 are sealed and protected by the housing 110 so that the monitor 100 may be mounted in exterior and wet environments.

Figure 3:
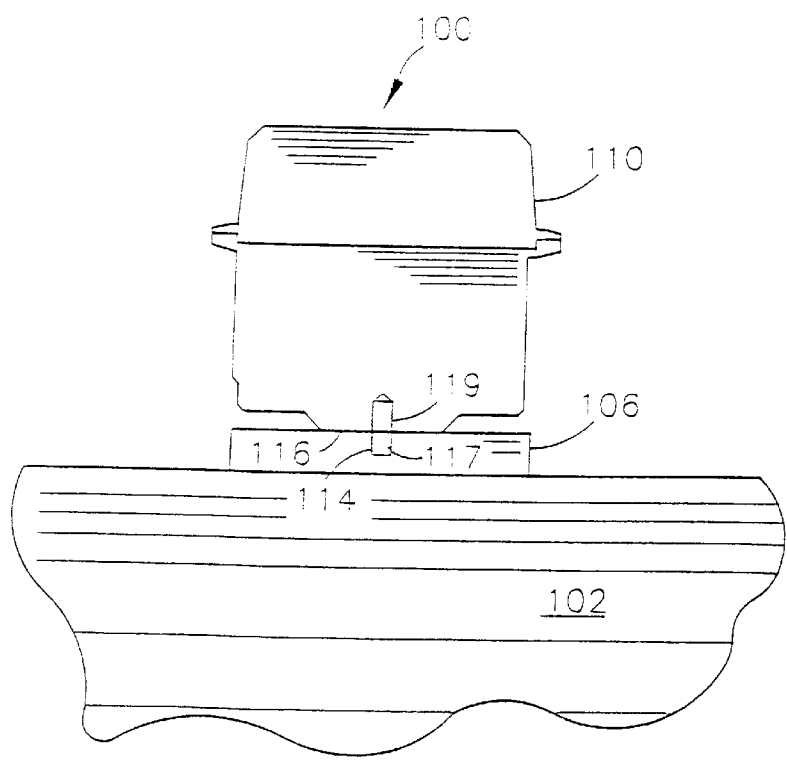
FIG. 3 is a sectional view of the motor monitor and mounting plate of FIG. 1.

Although the monitor 100 may be attached to the motor 102, or proximate to the motor 102, by any suitable attachment means, including bolts, screws, rivets, quick release fasteners, welding, adhesives, and magnets, a preferred means of attaching the monitor 100 to the motor 102 is shown in FIG. 1. A mounting plate 106 is secured to the motor frame 104 by bolts (not shown). Alternatively, the mounting plate 106 is attached to the frame 104 by an epoxy adhesive. As FIG. 3 illustrates, the mounting plate 106 includes a threaded recess 114 into which a threaded stud 117 is positioned. The stud 117 is of sufficient length to protrude above the plate 106 as shown. At the base of the monitor 100 is an engagement surface 116 that includes a threaded recess 119 sized to receive the stud 117. After mounting plate 106 is attached to the motor 102 and the stud 117 positioned within recess 114, the monitor 100 is then threaded onto that portion of stud 117 that protrudes above the mounting plate 106 so that the engagement surface 116 contacts the mounting plate 106.

Referring again to FIG. 2, an alternate means of attaching the monitor 100 to the motor 102 is illustrated. The mounting plate 106 is eliminated in FIG. 2 and stud 117 is instead threaded into an existing motor lifting eye bolt hole, shown generally at 115. For the attachment methods illustrated in FIGS. 2 and 3, attachment of the monitor 100 to the motor 102 can be accomplished by hand. No tools are needed.

The monitor 100 may be conceptually viewed as a device that provides a function somewhat similar to the function provided by the odometer of an automobile. An automobile odometer provides the operator with information relating to how many total miles the vehicle has been driven. The mileage indicated by the odometer is used by the operator, and others, as a single measure of the general health and condition of the automobile. Preventive maintenance, component life, and even the worth of an automobile are usually established by this single parameter (i.e., mileage). Because of the complexity and interrelationship of factors that effect the condition of electric motors, the health of an electric motor generally cannot be determined by a single parameter. For example, the following factors have been determined to affect the life of an electric motor:

1. Total run time (in hours);
2. Run time at various motor loading conditions;
3. Motor temperature;
4. Ambient temperature;
5. Number of starts and stops;
6. Motor vibration;
7. Balance and alignment of the motor;
8. Temperature history of the windings; and
9. Efficiency of the motor.

In a preferred embodiment, the monitor 100 of the present invention senses, collects, analyzes, and stores information useful for ascertaining the health and condition of electric motors based on these factors. Although it is preferable to incorporate within the monitor 100 the capability to analyze sensor data, such as by Fourier transform or preferably by fast Fourier transform (FFT), it is not required. If desired, the monitor 100 may be used simply as a device that senses and stores various operating characteristics with little or no analysis of the data performed within the monitor 100 itself. The stored sensor data could be downloaded to a base computer for analysis and archival.

Figure 4:
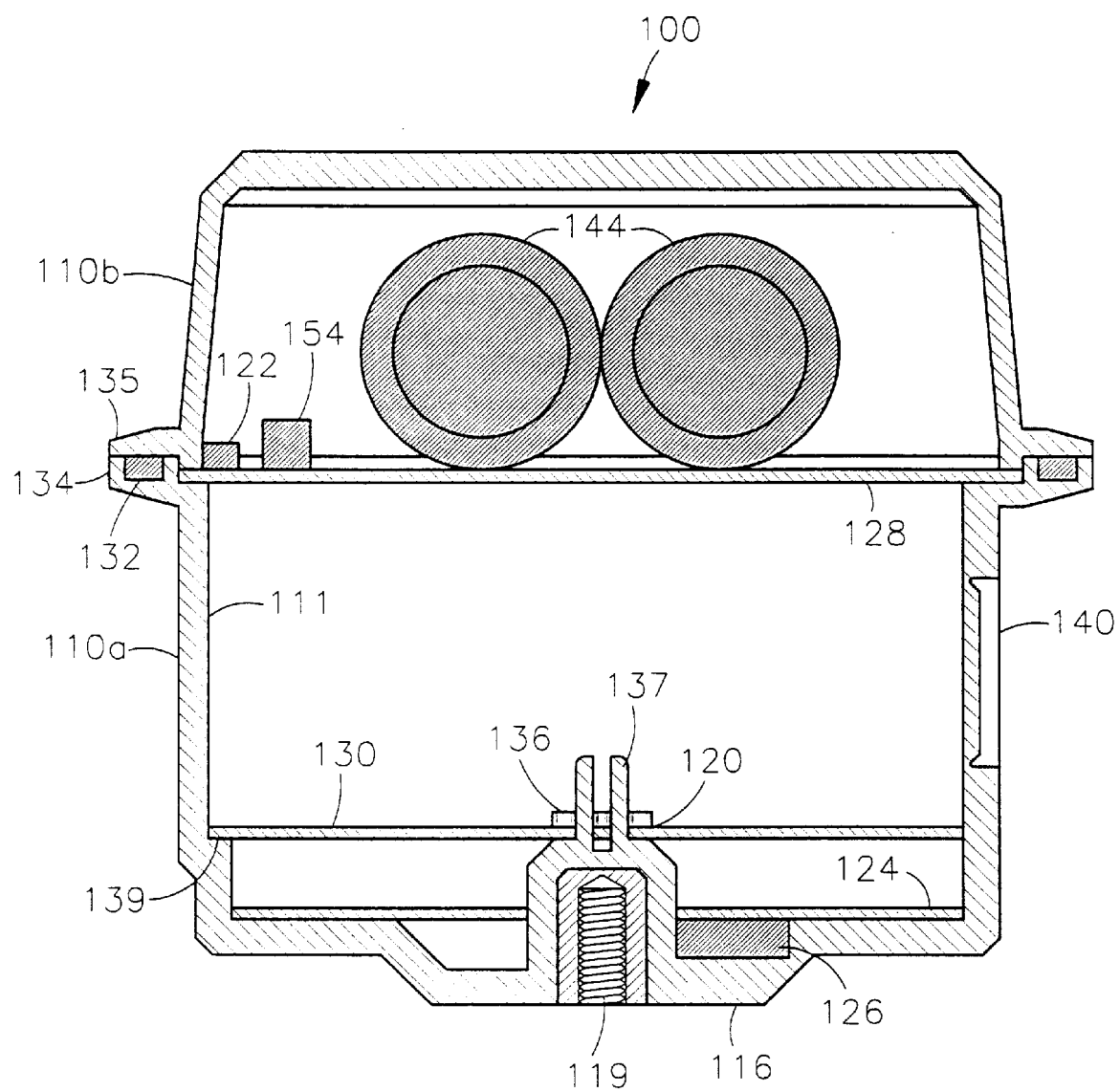
FIG. 4 is a cross-sectional view of the monitor of FIGS. 1 and 2.

As illustrated in the cross-sectional view of FIG. 4, the housing 110 of the monitor consists of a bucket 110a that is covered by lid 110b. At the top of he bucket 110a is an annular flange 134 which joins with a corresponding annular flange 135 formed at the bottom of the lid 110b. The bucket 110a and lid 110b are secured to each other by one or more clamps (not shown) which hold flanges 134, 135 in compression. Set within a channel formed in flange 134 is a rubber O-ring 132 to prevent intrusion of moisture and other contaminants at the interface of flanges 134, 135.

Figure 5:
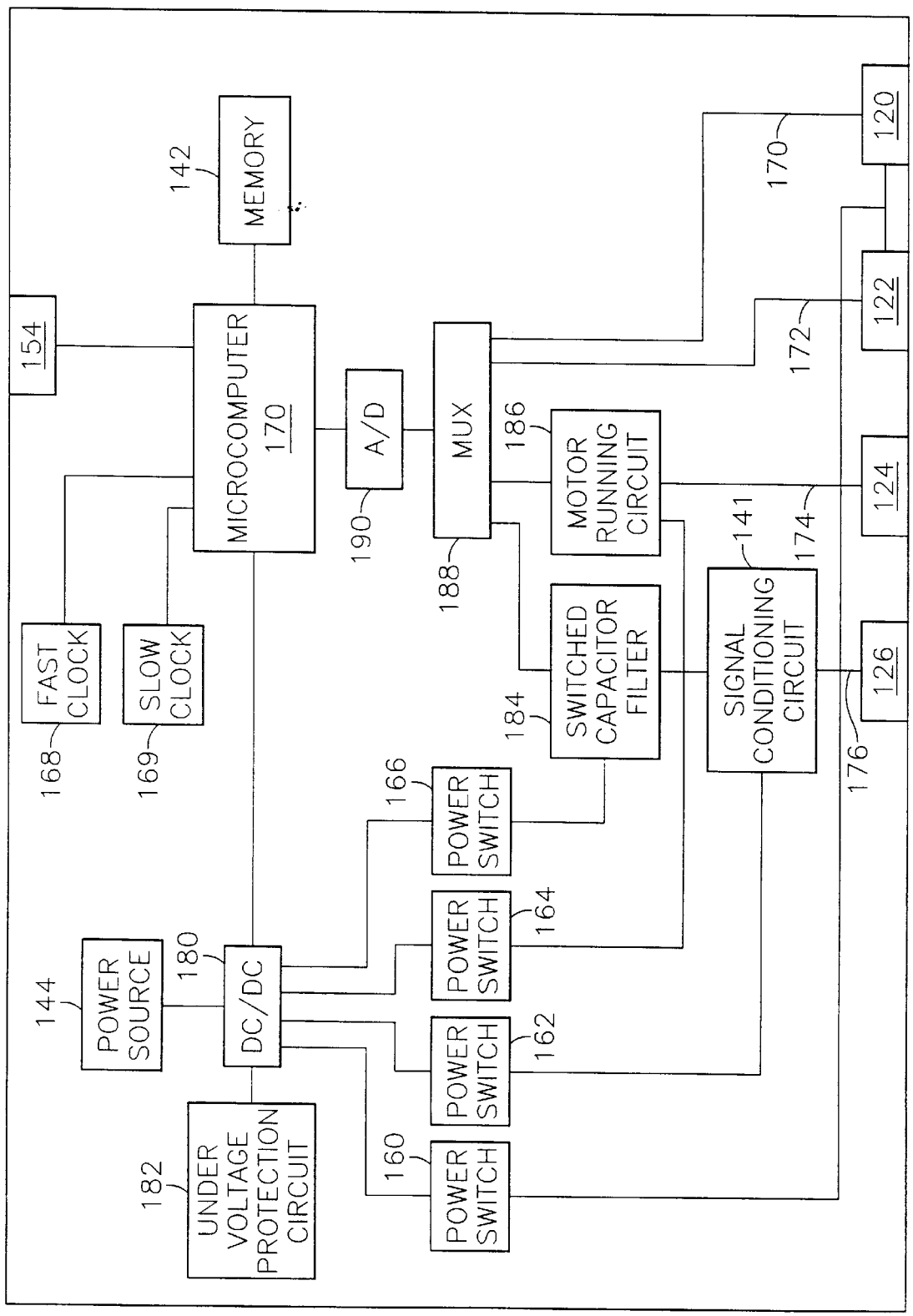
FIG. 5 is collectively represent a functional block diagram of a monitor in accordance with the invention.

As can be seen in FIG. 4, the engagement surface 116 extends beyond the base of the bucket 110a to elevate the monitor 100 and help reduce thermal conductivity between the 10 motor 102 and monitor 100. As FIG. 4 illustrates, and with further reference to the functional block diagram of FIG. 5, the motor frame temperature sensor 120 and the vibration sensor 126 are preferably mounted at or near a pedestal 121 which extends from the engagement surface 116 at the base of the monitor 100. The pedestal 121 provides structure for securing electronics board 130. The pedestal 121 is also fabricated from a thermally conductive material, such as metal, to enhance conduction of motor parameters such as heat and vibration from the motor 102 to the sensors. When the monitor 100 is threaded into the eye bolt hole 115 (FIG. 2) or mounting plate 106 (FIGS. 1 and 3), the sensors establish contact with the motor frame 104 through the engagement surface 116 so that temperature, flux, and vibrations produced by the motor 102 can be detected more readily.

Sensors positioned at or near the base of the monitor 100 for sensing various parameters of the motor 102 during operation include a motor frame temperature sensor 120, a magnetic flux sensor 124 for sensing motor flux, and a radial vibration transducer 126 for sensing motor vibrations generated by the motor 102 and transmitted through the motor frame 104. In a preferred embodiment, motor parameters are conducted from the motor 102 to the sensors. In addition to the sensors at the base of the monitor 100, an ambient temperature sensor 122 is mounted on top of a removable shelf 128 that is held in compression between the bucket 110a and lid 110b as shown. Alternatively, the ambient temperature sensor 122 is mounted on the lid 110b or bucket 110a, so long as the location chosen is sufficiently distal from the motor 102 to prevent motor heating from significantly affecting ambient temperature measurements. In a preferred embodiment, flux sensor 124 is a specially designed board of substantially circular dimension adhesively secured to the bottom of the bucket 110a. A metal trace deposited onto the board in a spiral pattern serves as the flux sensing element.

Although a preferred embodiment of the monitor 100 incorporates sensors within the monitor 100, it will be understood that sensors may be located external to the monitor 100 as well. For example, flux and vibration sensors may be incorporated within the motor 102, and at various locations within the motor 102. The outputs from these external sensors are interfaced with the monitor 100 by wires or by wireless means, such as infrared data link.

Outputs from sensors 122, 124, and 126 are electrically connected to an electronics board 130 where the sensor outputs are processed and stored as motor operating parameters. Two D cell batteries 144, which provide a source of dc electrical power for the monitor 100, are secured to shelf 128. Equipment that is secured to shelf 128, including batteries 144, ambient temperature sensor 122, and infrared communications port 154, are electrically connected to the electronics board 130 via a ribbon cable. Motor frame temperature sensor 120 is attached directly to the electronics board 130.

As shown in FIG. 4, the electronics board 130 is positioned immediately above the flux sensor board 124. A press nut 136 and associated hold down fitting 137 secures the electronics board 130 in place.

Additional provisions are made for the attachment of a remote temperature sensor (not shown) to the electronics board 130 for measuring, for example, internal stator temperature. Formed in the wall of the bucket 110a is a knockout section 140. To connect a remote temperature sensor to the electronics board 130, the knockout section 140 is removed and a conduit fitting is attached in its place. Electrical connection between the remote sensor and board 130 is then provided via one or more electrical conductors routed through a conduit attached to the conduit fitting. The remote temperature sensor, when used, enables the user to measure internal stator temperature so that stator temperature increase can be determined from trend data.

Sensor outputs are processed and stored by electronics contained on the electronics board 130. As illustrated in the functional block diagram of FIG. 5, the electronics include analog signal conditioning circuitry 141 for amplifying and frequency filtering vibration signals output by vibration sensor 126 on line 176. A switched capacitor filter 184 provides further selective frequency filtering of the vibration signal. In a preferred embodiment, the switched capacitor filter 184 is a variable frequency filter.

Signal conditioning circuitry for the flux sensor output is preferably contained in a motor running circuit 186. Motor running circuit 186 also functions to receive the output of the flux sensor 124 on line 174 and determine whether the motor 102 is in operation based on the signal strength of the flux sensor output. When the motor 102 is running, leakage flux produce by the motor 102 causes a relatively high strength signal to be output by the flux sensor 124. The motor running circuit 186 receives the flux sensor output and recognizes the high strength signal as being characteristic of an operating motor. In a preferred embodiment, motor running circuit 186 determines the on/off state of the motor 102 by comparing the signal on line 174 to a predetermined threshold to determine when the motor 102 is running. Similarly, when the motor 102 is not running, no flux is produced by the motor 102 and flux sensor 124 will output a signal on line 174 which has little or no strength.

No signal processing is needed for the ambient temperature sensor 122 or the motor frame temperature sensor 120. Instead, the outputs of these sensors on lines 172 and 170 are provided directly to a multiplexor 188. The output of the switched capacitor filter 184 and the motor running circuit 186 are also input to the multiplexor 188. Multiplexor 188 multiplexes these signals for digitization by an analog-to-digital (A/D) converter 190, which in a preferred embodiment is a 12-bit converter. The digitized signals are then input to a microcomputer 200 for processing and/or storage.

Microcomputer 200, which in a preferred embodiment is a model no. TMP93CS41, 16-bit microprocessor manufactured by Toshiba of Japan, is programmed to control the overall operation of the monitor 100, including the processing and storage of sensor data. A memory 142 is connected to the microcomputer 200 for storing sensor data. An electrical power source 144, which is preferably two D cell alkaline batteries connected in series or two D cell lithium batteries connected in parallel, provides all electrical power for the monitor 100. It will be understood that, for purposes of simplifying the block diagram illustration of FIG. 5, connections between the power source 144 and sensor electronics are omitted.

To extend the life of the power supply 144 and maximize its useable energy, various power saving features are incorporated into the monitor electronics. One way in which power is conserved is by operating the microcomputer 200 at low speed when high-speed operation is not needed. For high-speed operation, the microcomputer 200 uses the clock signal produced by a fast clock 168. In a preferred embodiment, fast clock 168 outputs a high frequency clock signal having a frequency in the megahertz range. In a preferred embodiment, the specific frequency of the fast clock 168 is about 7.4 megahertz (MHZ). A slow clock 169 is provided for operation of the microcomputer 200 at low speed. Preferably, slow clock 169 outputs a clock signal having a frequency in the kilohertz range. In a preferred embodiment, the specific frequency of the slow clock 169 is about 32.8 kilohertz (KHz). If desired, the high-speed clock signal may be divided to obtain a different high-speed clock signal or to provide a low-speed clock signal which eliminates the need for slow clock 169. For example, the high-speed clock signal may be divided so that the resulting clock signal is a fraction of the high-speed clock signal, such as ½, ¼, ⅛, ¹⁄₁₆, and the like.

Power is also conserved by placing the microcomputer 200 in a low-power sleep mode when the microcomputer 200 is not needed to perform tasks that require a- high level of speed and power. For example, in a preferred embodiment the microcomputer 200 is in a low-power sleep mode when not receiving sensor data or listening to the communications port 154. In its sleep mode, the only portion of the microcomputer 200 that is operating is its counters, which are running based on the clock signal output by slow clock 169. The fast clock 168 is disabled during the microcomputer's sleep mode.

Periodically, and preferably every five seconds, the microcomputer 200 wakes up and turns on the communications port 154 and the fast clock 168 (block 430). When communicating with a peripheral device through the communications port 154, the fast clock is used for operation of the UART portion of microcomputer 200. The UART is that portion of the microcomputer 200 which converts data to serial stream for RS-232 communication. With the communications port 154 and the fast clock 168 enabled, the microcomputer 200 is "halted" as it listens for approximately 40 milliseconds for communications transmissions being received by the communications port 154. If nothing is heard during the 40 millisecond halt time, a background counter wakes up the microcomputer 200 so that it can turn off the fast clock 168 and communications port. With the fast clock 168 and communications port 154 turned off, the microcomputer 200 goes back to sleep and repeats the process at the next five second interval. If, during the 40 millisecond halt time, the microcomputer 200 does perceive that a peripheral device is trying to communicate with the monitor 100, the microcomputer 200 wakes up to a full power, high-speed mode and receives and executes whatever data and instructions are being transmitted to the communications port 154 until receipt of the data stream and execution of the instructions are complete.

As described above, the electrical power supply 144 for the monitor 100 is preferably two D cell alkaline batteries connected in series to provide a 3-volt DC power supply. A DC/DC converter 180 is connected to the power supply to maintain electrical energy supplied to the monitor electronics at a constant 3-volt level even when the batteries 144 are near depletion. Thus, DC/DC converter 180 maximizes the useable energy stored in the batteries 144 and may, if desired, completely deplete the batteries 144 of all electrical energy. However, 100% depletion of the batteries 144 is not preferred since it may cause the batteries to leak and thereby foul or destroy the monitor electronics.

A further power saving feature of the monitor electronics is the ability of the microcomputer 200 to switch off any unneeded portion(s) of the monitor electronics. In a preferred embodiment, this feature is accomplished by use of four power switches 160–166 which are controlled by the microcomputer 200 through the DC/DC converter 180. Power switch 160 controls power supplied to each of the temperature sensors 120, 122, power switch 162 controls power supplied to the signal conditioning circuit 141, power switch 164 controls power supplied to the motor running circuit 186, and power switch 166 controls power supplied to the switched capacitor filter 184. Those portions of the monitor electronics which are controllable by power switches 160–166 are normally not powered. When the microcomputer 200 awakes at the predefined data acquisition interval (see Table 1 below), the microcomputer 200 instructs the DC/DC converter 180 to turn on those portions of the monitor electronics needed to acquired the desired data.

An undervoltage protection circuit 182 is in electrical communication with the DC/DC converter 180. The undervoltage protection circuit 182 monitors the voltage level of electrical power being supplied through the DC/DC converter 180. When electrical power drops below a threshold value, which is preferably 2.7 volts, the undervoltage protection circuit 182 resets the microcomputer 200. Before resetting the microcomputer 200, the undervoltage protection circuit 182 sends a signal to the microcomputer 200 notifying it of an impending reset command. A delay is then provided so that the microcomputer 200 may, if needed, complete any tasks that it is currently performing, such as writing data to memory 142. The microcomputer 200 also instructs the DC/DC converter 180 to turn off the switched capacitor filter 184, motor running circuit 186, signal conditioning circuit 141, and temperature sensors 170, 172 via power switches 160–166, and the fast clock 168 is turned off. Once reset is complete, the microcomputer 200 is placed in a low-speed, low power sleep mode to further reduce electrical power consumption.

Power is also conserved by the manner in which the monitor electronics determine motor speed. As part of the process of determining motor speed, the flux signal on line 174 is passed through a 0–60 Hz, fixed-frequency, low-pass filter contained in the motor running circuit 186. The filtered flux signal is then transformed to the frequency domain by fast Fourier transform (FFT) and the resultant flux spectrum is processed to determine the frequency at which the first line frequency peak appears. Motor speed is then calculated as the difference between line frequency and slip frequency.

Since the first line frequency peak will typically occur within 0–60 Hz for most electric motors, the fixed-frequency filter of the motor running circuit 186 conserves power by eliminating the unnecessary consumption of electrical power that would otherwise be required to perform an FFT on an unfiltered flux signal.

In operation, flux board 124 senses magnetic flux produced by the motor 102 and outputs an electrical signal corresponding to sensed flux on line 174. Flux board 124 measures motor leakage flux much like an antenna. Significant information about the motor's condition can be determined from the flux signal, including running or stopped status, motor speed and load (computed from slip), and startup acceleration time. In addition, by performing a high resolution Fourier transform of the flux signal, preferably a fast Fourier transform (FFT), one can determine voltage phase imbalance, stator turn to turn shorts, and rotor bar condition.

Motor life factors (including motor run time, motor load and cumulative run time in various load ranges, motor starts, and the time required for a starting motor to reach operating speed) are computed from the sensor signals. In addition, several motor electrical condition indicators are measured from a high resolution flux spectrum. Voltage phase imbalance, stator condition, and rotor condition are measured as relative, trendable parameters. By obtaining a measured current spectrum for the motor at full load, a calibration and severity indication of these relative values can be determined.

Motor vibrations sensed by vibration transducer 126 are converted into a corresponding electrical signal and output on line 176. Preferably, the vibration signals are transformed from the time domain to the frequency domain by the monitor 100 using Fourier transform or fast Fourier transform (FFT) to produce information corresponding to motor operating parameters. From this sensor, the monitor 100 can determine the following parameters:

1. Overall vibration;
2. Subharmonics;
3. 1×;
4. 2×;
5. High frequency in acceleration units;
6. 3×–8× synchronous energy;
7. 1×–8× nonsynchronous energy;
8. >8× synchronous energy; and
9. >8× nonsynchronous energy.

From this set of vibration parameters, mechanical faults are detected including imbalance, looseness, bearing degradation, oil instability in sleeve bearings, resonances, and others. The cumulative time the motor spends in each of three general vibration ranges (low, medium, and high) is also tracked.

The frame temperature sensor 120 outputs an electrical signal on line 170 corresponding to the temperature of the motor frame 104, and ambient temperature sensor 122 outputs an electrical signal on line 178 corresponding to ambient temperature. The difference between the two temperatures is the motor heating. The microcomputer 200 receives each of the sensor signals on lines 170–176, processes and analyzes the signals, and stores the processed signals. The monitor 100 tracks ambient temperature, motor frame temperature, and motor heating as trendable parameters, as well as the cumulative amount of time motor heat resides in three temperature ranges (low, medium, and high). Temperature profile investigations of a motor's external frame 104 shows the hottest points on a motor are midway between front and back on the side or top of the motor. Typically, open frame motors show a maximum external temperature range between 35° C. and 50° C. Totally enclosed motors typically range between 40° C. and 60° C. These temperature ranges are considered normal.

A general rule of temperature effect on motor reliability is that a long term 10° C. rise in stator temperature cuts a motor's life in half. There are many factors which can cause a motor to run hot, including:

1. Over or under voltage;
2. Frequency deviation from 60 Hz;
3. Voltage imbalance;
4. Harmonic content;
5. Altitude derating;
6. High ambient temperature (>40° C.);
7. Dirty or blocked cooling passages; and
8. Excessive load.

All of these factors result in an increase in motor heating and a significant reduction in motor life.

Data is first stored within the microcomputer's internal random access memory (RAM). Data stored in RAM is then periodically transferred to an external memory device 142, such as an electrically erasable programmable read only memory (EEPROM), for longer term storage.

From the sensor outputs, many different types and formats of motor operating parameters and information can be measured and/or calculated. For example, the cumulative run time of the motor 102 can be determined and stored for the life of the motor 102. In addition, if the user wanted to know the cumulative run time of the motor 102 for the past 30 month period, that information can be determined and stored as well. Table 1 illustrates the types and formats of parameters that are determined and stored in a preferred embodiment of the invention, where the leftmost column identifies various parameters that are measured, the middle column identifies the measurement period(s) for each parameter, and the rightmost column identifies the interval at which parametric measurements are acquired.

TABLE 1

| PARAMETER | MEASUREMENT | ACQUISITION INTERVAL |
|---|---|---|
| Motor Life Parameters | | |
| 1. Run time | 180 days, 60 months, life | 1 minute |
| 2. Starts | 180 days, 60 months, life | 1 minute |
| 3. Starting time | 180 days, 60 months, life | 1 minute |
| 4. Light load time 0–75% | 180 days, 60 months, life | 1 minute |
| 5. Rated load time 76–105% | 180 days, 60 months, life | 1 minute |
| 6. High load time >106% | 180 days, 60 months, life | 1 minute |
| 7. Low motor heating time | 180 days, 60 months, life | 1 minute |
| 8. Mid motor heating time | 180 days, 60 months, life | 1 minute |
| 9. High motor heating time | 180 days, 60 months, life | 1 minute |
| 10. Low vibration time | 180 days, 60 months, life | 1 minute |
| 11. Mid vibration time | 180 days, 60 months, life | 1 minute |
| 12. High vibration time | 180 days, 60 months, life | 1 minute |
| Trend Parameters | | |
| 13. Motor frame temperature | maximum, average | 1 minute |
| 14. Ambient temperature | maximum, average | 1 minute |
| 15. Motor heating (Frame-ambient) | maximum, average | 1 minute |
| 16. Motor load | maximum, average | 1 minute |
| 17. Voltage phase imbalance | maximum, average | 1 hour |
| 18. Stator condition | maximum, average | 1 hour |
| 19. Rotor condition | maximum, average | 1 hour |
| 20. Subharmonic vibration | maximum, average | 1 hour |
| 21. 1X vibration | maximum, average | 1 hour |
| 22. 2X vibration | maximum, average | 1 hour |
| 23. Harmonic vibration 3X–8X | maximum, average | 1 hour |
| 24. Harmonic vibration >8X | maximum, average | 1 hour |
| 25. Non-harmonic vibration 1X–8X | maximum, average | 1 hour |
| 26. Non-harmonic vibration >8X | maximum, average | 1 hour |
| 27. HFD | maximum, average | 1 hour |
| 28. Overall vibration | maximum, average | 1 hour |
| Maintenance Log Parameters | | |
| 29. Lubrication date/time | | As performed |
| 30. Alignment date/time | | As performed |
| 31. Bearing change date/time | | As performed |
| 32. Flux spectrum 1600 lines | Last 12 months (one/month) | 1 hour |
| 33. Vibration spectrum, 400 lines, 300 Hz | Last 52 weeks (one/week) | 1 hour |
| 34. Vibration spectrum, 800 lines, 2500 Hz | Last 12 months (one/month) | 1 hour |
| For Variable Frequency Motors | | |
| 35. RPM cumulative time <50% max rating | 180 days, 60 months, life | 1 minute |

TABLE 1-continued

| PARAMETER | MEASUREMENT | ACQUISITION INTERVAL |
|---|---|---|
| 36. RPM cumulative time 50–100% max rating | 180 days, 60 months, life | 1 minute |
| 37. RPM cumulative time >100% max rating | 180 days, 60 months, life | 1 minute |
| 38. RPM | maximum, average | 1 minute |

Table 1 is divided into four categories of parameters—motor life, trend, maintenance, and variable frequency motor parameters. Each parameter is measured frequently and stored in a daily and monthly buffer. The maximum and average levels for certain parameters are stored daily and kept for 180 days in a circular buffer. Each average and maximum parameter value is stored monthly in the EEPROM 142 and saved for 60 months (5 years). Some parameters are stored as the cumulative value over defined intervals, including intervals of 180 days, 60 months, and lifetime.

For example, for the motor life parameters (parameters 1–12), the cumulative value of each parameter is stored for the last 180 days, the last 60 months, and life. For trend parameters (parameters 13–28), each parameter is stored once per day for the last 180 day period and once per month for the last 60 month period.

In the circular data buffers, as new data is acquired, the oldest data in the cycle is deleted. For example, in the circular buffer for "motor frame temperature", when the data for the 61st month is acquired, it overwrites the data for the first month. Therefore, to maintain a complete historical record of this parameter, data relating to motor frame temperature should be downloaded from the monitor 100 and placed in long term electronic storage at least once every 60 months.

As Table 1 indicates, information pertaining to motor maintenance may be input and stored in the monitor 100. A record of all maintenance activity on the motor 102 can be entered through an external device, such as a CSI™ 2110 data collector, and stored in the monitor 100. Maintenance information includes the time and date of lubrication, machine alignment, and bearing replacements.

Data and information is transmitted to and from the monitor 100 through a communications port 154 (FIGS. 4 and 5), which is preferably a serial infrared (IR) data link. The lid 110b is fabricated from an IR transmissible material, such as a polycarbonate material, so that communications port 154 can be protected within the monitor's housing 110. Communications port 154 provides an interface for communicating with an external device, such as a portable data collector or notebook computer, via infrared data link to enable the history information to be downloaded. The portable data collector or notebook computer may also be used to program, or download programs to, the monitor 100. For the parameters given in Table 1, data would need to be downloaded at least every 180 days to avoid loss of any data. In other applications, the circular data buffers may be designed with longer or shorter circular lives. The downloaded information can be further analyzed to provide an indication of the remaining useful life of the motor 102 and to diagnose problems.

At least two options are available for collecting stored data. In one option, a portable data collector is used as a data gatherer only, with no data display capability. The data is simply moved from the monitor 100 to a base computer for analysis and archival. Another option for data collection utilizes a full Windows™ compatible pad computer running the necessary data analysis software. The pad computer should be rugged enough to analyze and display motor parametric data in the field.

In a preferred embodiment, all electrical power for the monitor 100 is provided by one or more dc batteries 144, such as two replaceable, D cell, Alkaline batteries 144 as previously discussed with respect to FIG. 4. Various power saving features are employed to keep power consumption to a minimum in the interest of prolonging battery life to at least two years.

Other sources of electrical power suitable for use within the monitor 100 are available. For example, the D cell Alkaline batteries of the preferred embodiment could be replaced with a Peltier device. This type of device includes a material which, when heated on one side and cooled on the other, produces electrical power. The larger the temperature differential, the more power that the device is able to produce. The Peltier device would take advantage of motor heat to elevate the temperature of the hot side of the device, while ambient cooling would be used to reduce the temperature of the cold side. As another alternate source of power, a 120 volt power line can be connected to the monitor 100.

During operation of an electric motor 102, heat generated by the motor is typically transferred by the motor frame 104 to the ambient air, creating a heat blanket that surrounds the motor frame 104. A heat blanket may also result from external factors, such as heating induced by absorption of sunlight. Under certain conditions with some motors, this heat blanket may be large enough to adversely effect the accuracy of the ambient temperature sensor 122 and significantly reduce battery life. Heat generated by the motor 102 and external factors is also conducted from the frame 104 and surrounding ambient air to the monitor 100.

To reduce adverse effects of elevated temperature on temperature sensitive equipment such as the ambient temperature sensor 122 and batteries 144, such equipment is preferably located on shelf 128 shown in FIG. 4. As seen in FIG. 4, shelf 128 is elevated by the bucket 110a so that equipment located on the shelf 128 is largely if not totally removed from the motor's heat blanket. With the exception of the pedestal 121, the bucket 110a is fabricated from a low thermally conductive material and therefore functions to shield convective heat from the ambient temperature sensor 122 and batteries 144.

As discussed above, life history parameters are stored in memory 142 where they can be accessed and downloaded via communications port 154. To determine these parameters, microcomputer 200 utilizes signals generated by the sensors 120–126. Some of the sensor signals are utilized by the microcomputer 200 with little or no conditioning of the signals, while other sensor signals receive some amount of conditioning by the signal conditioning circuitry 141, including amplification and frequency filtering, before microcomputer 200 uses them. For example, to determine "run time", the output of flux board 124 may be used directly by microcomputer 200 as an indication that the motor 102 is operating. To ensure the flux signal has sufficient strength, it is first amplified and frequency filtered as needed by the signal conditioning circuitry 141 before it is received by the microcomputer 200. The microcomputer's internal counters are used to maintain a count of the total hours during which magnetic leakage flux is being generated by the motor 102. In this manner, the life history parameter of "run time" shown in Table 1 is determined. Alternatively, the outputs of frame temperature sensor 120 and accelerometer 126 may be utilized as indications of when the motor 102 is operating.

As other examples of life history parameters that are determined directly from sensor outputs, consider the parameter of "maximum motor frame temperature". To determine this parameter, microcomputer 200 compares the current frame temperature sensor output on line 170 to the previous maximum frame temperature. The stored maximum frame temperature is replaced by the current frame temperature when the current frame temperature exceeds the stored maximum. Similarly, the parameter labeled "starts" is determined directly from measured flux, or if preferred, it may be determined by monitoring temperature and vibration. When both exceed a selected threshold, a "running" condition is assumed. When either falls below its threshold, a "stopped" condition is assumed.

To determine the three "motor heating time" parameters, microcomputer 200 subtracts ambient temperature from the frame temperature to arrive at a motor heating temperature. Total motor run time at each of the low, mid, and high heating levels identified in Table 1 is then determined from the microcomputer's internal counters.

The analog output of flux board 124 is received from line 174 and amplified before being used by the microcomputer 200. As previously stated, microcomputer 200 uses a signal representative of magnetic flux produced by the motor 102 to ascertain when the motor 102 is operating. The analog output of vibration transducer 126, which represents vibration in the acceleration domain, is received by the signal conditioning circuitry 141 from line 176 where the vibration signal is preferably amplified, frequency filtered, and integrated. The conditioned vibration signal is then provided to microcomputer 200 for storage and/or analysis. For example, in a preferred embodiment the microcomputer 200 is programmed to transform sensor signals such as vibration and flux from the time domain to the frequency domain by means of a Fourier transform or a fast Fourier transform, producing spectral data. Integration of the vibration signal to the velocity domain may also be performed by the microcomputer 200.

Following an analog-to-digital conversion, the velocity domain vibration signal is used by the microcomputer 200 to determine the various vibration parameters identified in Table 1. Preferably, the "maximum vibration" is the maximum vibration measured in velocity units, but alternately, velocity may be integrated to obtain vibration measured in displacement units and the maximum displacement is, in this alternate embodiment, stored as the "maximum vibration". Motor speed can be determined from a Fourier transform, preferably a high resolution FFT of the digitized vibration signal. Preferred methods of determining motor speed from vibration spectral data are disclosed in pending U.S. patent application Ser. No. 08/644,176, filed May 10, 1996, and entitled METHOD FOR DETERMINING ROTATIONAL SPEED FROM MACHINE VIBRATION DATA, the entire contents of which are expressly incorporated herein by reference. The difference between actual speed and synchronous speed at no load is used to determine motor load.

During initial installation and setup of the monitor 100, the monitor 100 is setup for the particular motor 102 on which it is installed. During this installation mode, a peripheral device such as a notebook computer or portable data collector is connected to the monitor 100 via the communications port 154 for programming, or training. Various settings and adjustments are made to the monitor 100 during setup, including full load speed, number of poles, motor identification, and others.

Once installation and training are completed, operation of the monitor 100 is completely self-contained and maintenance-free. As previously described, the monitor's internal battery 144 and electronics are configured to operate for at least two years before battery power is depleted— depending on data acquisition intervals. Data stored in the memory 142 should be periodically downloaded, at least once every six months, and analyzed to determine the health and operating condition of the motor 102. When life-extending maintenance is performed on the motor 102, that maintenance information should be input to the monitor 100.

Figure 6:
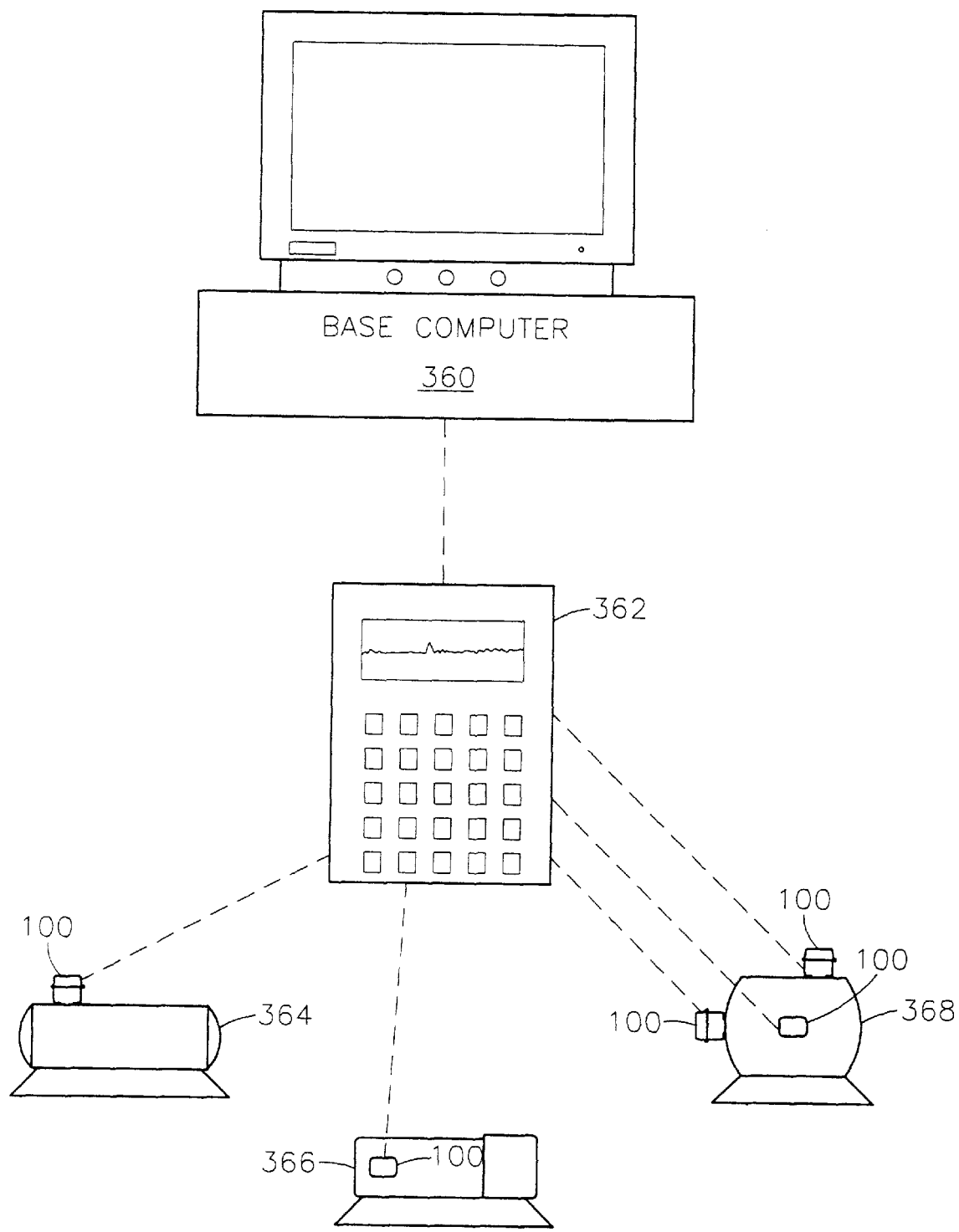
FIG. 6 is a diagrammatic drawing illustrating a monitoring system that employs a portable data collector to periodically download data stored by various monitors and transfer the downloaded data to a base computer for processing and analysis.

In a typical industrial facility, tens or even hundreds of electrical machines may exist. As FIG. 6 illustrates, the present invention provides plant personnel with a convenient system for monitoring each machine. Illustrated in FIG. 6 are three electric motors 364, 366, and 368 onto which monitors 100 have been attached. A portable data collector 362, such as a CSI™ 2120 data collector, is used to periodically download data stored in each of the monitors' memory 142. After all downloading of data is completed, the collected data is transferred to a base computer 360 for analysis and archival. Alternatively, the data collector 362 may be programmed to analyze the downloaded data on site to provide a quick determination of the operating condition of a particular motor. As described previously herein, a further function of the data collector 362 is to program, or download programs from, the monitors 100.

Figure 7:
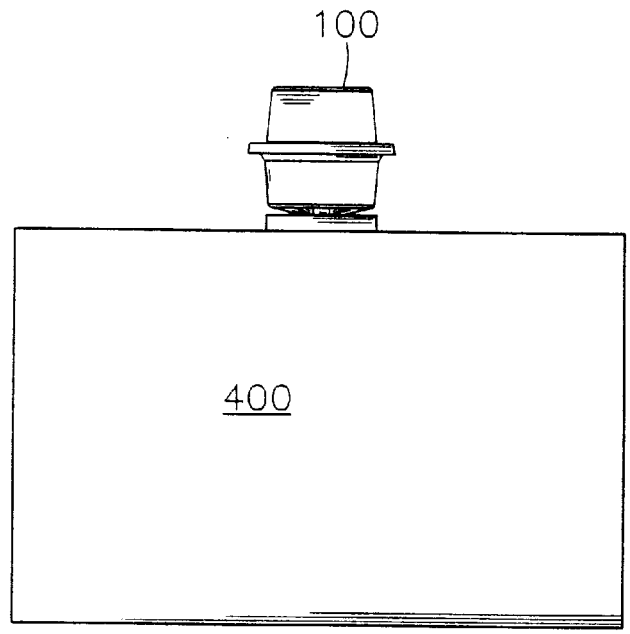
FIG. 7 is a side view showing a monitor of the present invention attached to a pump.

For machines other than electric motors, the monitor 100 may be configured slightly differently than described above since the specific factors which affect the life of a machine may vary based on the type of machine that is being monitored. For example, as shown in FIG. 7, the monitor 100 is attached to a pump 400 to monitor the pump's operating condition. Depending on the type and amount of data that is desired, a single sensor or a plurality of sensors may be employed to monitor the pump's operating condition. Since a high percentage of potential faults within the pump 400 are detectable from vibration, a preferred embodiment of the monitor 100 of FIG. 7 includes a single vibration sensor with no flux or temperature sensors. Vibration produced by the pump 400 is sensed by the monitor 100 and processed, recorded, and/or analyzed as described above to ascertain the health and condition of the pump.

Figure 8:
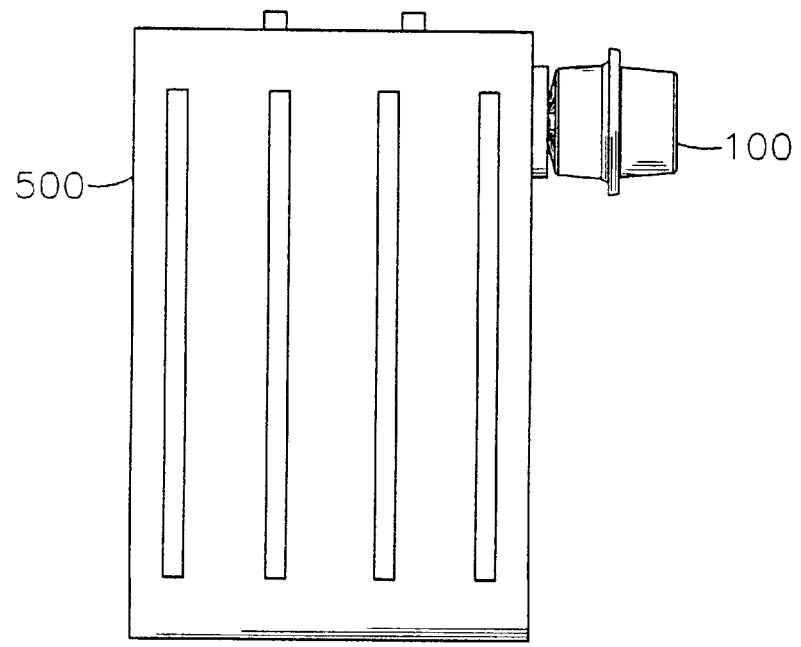
FIG. 8 is a side view showing a monitor of the present invention attached to a transformer.

As shown in FIG. 8, the monitor 100 can be employed to monitor the operating condition of a transformer 500 by attaching the monitor 100 on or near the transformer 500. Flux produced by the transformer 500 can be sensed by the monitor 100 and analyzed to ascertain many faults which are typically experienced by transformers, whereas vibration produced by the transformer provides little useful information for ascertaining the condition of the transformer 500. Accordingly, the monitor 100 of FIG. 8 preferably includes only a single flux sensor with no vibration of temperature sensors. If additional data is desired, the monitor 100 may further include a temperature sensor for monitoring the transformer's temperature.

It is contemplated, and will be apparent to those skilled in the art from the foregoing specification, drawings, and examples that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A monitor that attaches to a machine, said monitor comprising:
   a structural enclosure;
   means for attaching said enclosure to the machine;
   a power source disposed in said enclosure for supplying electrical power to the monitor;
   at least one sensor disposed in said enclosure for sensing one or more operating characteristics of the machine and producing sensor signals corresponding to the sensed characteristic;
   a microcomputer disposed in said enclosure for receiving and processing the sensor signals to produce sensor data, said microcomputer having a high-power operating mode and a low-power operating mode and being programmed to operate in the low-power operating mode when high-power operation is not needed;
   memory for storing sensor data; and
   a communications port for communicating with a peripheral device.

2. The monitor of claim 1, further comprising a power switch interconnecting said power source and said at least one sensor and being controllable by said microcomputer to remove electrical power from said at least one sensor when said at least one sensor is not in use.

3. The monitor of claim 1, further comprising:
   a signal conditioning circuit for receiving and processing the sensor signals to produce processed sensor signals; and
   a power switch interconnecting said power source and said signal conditioning circuit and being controllable by said microcomputer to remove electrical power from said signal conditioning circuit when the signal conditioning circuit is not in use.

4. The monitor of claim 3, further comprising:
   a frequency filter circuit for filtering the processed sensor signals to remove unwanted frequency components; and
   a second power switch interconnecting said power source and said frequency filter circuit and being controllable by said microcomputer to remove electrical power from said frequency filter circuit when the frequency filter circuit is not in use.

5. The monitor of claim 1 wherein said at least one sensor includes a flux sensor for sensing flux generated by the machine to produce a corresponding flux signal, said monitor further including a frequency filter for filtering the flux signal to remove all frequency components of the flux signal except those in a range from about 0–60 Hertz to produce a filtered flux signal, said microcomputer being further operable to transform the filtered flux signal from the time domain to the frequency domain to produce a flux spectrum which includes a first line frequency peak.

6. The monitor of claim 5, further comprising a power switch interconnecting said power source and said frequency filter and being controllable by said microcomputer to remove electrical power from said frequency filter when the frequency filter is not in use.

7. The monitor of claim 1, further comprising a DC/DC converter connected to said power source for increasing the amount of useable electrical power in said power source.

8. The monitor of claim 7, further comprising an undervoltage protection circuit in electrical communication with said microcomputer and said DC/DC converter for resetting the microcomputer and placing the microcomputer in the low-speed operating mode when the undervoltage protection circuit determines that electrical power supplied by the DC/DC converter has dropped below a threshold level.

9. The monitor of claim 1 wherein said communications port includes a wireless communications port for wirelessly communicating with a peripheral device.

10. The monitor of claim 1 wherein said at least one sensor includes a plurality of sensors for sensing a plurality of machine operating characteristics and producing a plurality of sensor signals, said monitor further including:
    a multiplexor for multiplexing the sensor signals produced by said plurality of sensors to produce a multiplexed sensor signal; and
    an analog-to-digital converter for digitizing the multiplexed sensor signal to produce a digital sensor signal which is received and processed by said microcomputer.

11. An apparatus for reducing electrical power consumption in a machine monitor, the apparatus comprising:
    a microcomputer having a high-speed operating mode and a low-speed operating mode;
    a fast clock for producing a high frequency clock signal to operate said microcomputer in a high-speed mode;
    a slow clock for producing a low frequency clock signal to operate said microcomputer in a low-speed mode;
    a communications port in electrical communication with the microcomputer for communicating with a peripheral device;
    at least one sensor for sensing an operating characteristic of a machine and producing sensor signals corresponding to the machine operating characteristic that is sensed, said sensor signals being received and processed by said microcomputer to produce sensor data; and
    a power source for supplying the monitor with electrical power;
    wherein said microcomputer is operable to remove electrical power from at least said communications port when the communications port is not in use.

12. The apparatus of claim 11, further comprising a power switch interconnecting said power source and said at least one sensor and being controllable by said microcomputer to remove electrical power from said at least one sensor when said at least one sensor is not in use.

13. The apparatus of claim 11, further comprising:
    a signal conditioning circuit for receiving and processing the sensor signals to produce processed sensor signals; and
    a power switch interconnecting said power source and said signal conditioning circuit and being controllable by said microcomputer to remove electrical power from said signal conditioning circuit when the signal conditioning circuit is not in use.

14. The apparatus of claim 13, further comprising:
    a frequency filter circuit for filtering the processed sensor signals to remove unwanted frequency components; and
    a second power switch interconnecting said power source and said frequency filter circuit and being controllable by said microcomputer to remove electrical power from said frequency filter circuit when the frequency filter circuit is not in use.

15. The apparatus of claim 11 wherein said at least one sensor includes a flux sensor for sensing flux generated by the machine and producing a corresponding flux signal, said apparatus further comprising a frequency filter for removing all frequency components from the flux signal except those in a range from about 0–60 hertz to produce a filtered flux signal, said microcomputer being further operable to transform the filtered flux signal from the time domain to the frequency domain to produce a flux spectrum which includes a first line frequency peak.

16. The apparatus of claim 15, further comprising a power switch interconnecting said power source and said frequency filter and being controllable by said microcomputer to remove electrical power from said frequency filter when the frequency filter is not in use.

17. The apparatus of claim 11, further comprising a DC/DC converter connected to said power source for increasing the amount of useable electrical power in said power source.

18. The apparatus of claim 17 further comprising an undervoltage protection circuit in electrical communication with said microcomputer and said DC/DC converter for resetting the microcomputer and placing the microcomputer in the low-speed operating mode when the undervoltage protection circuit detects that electrical power supplied by the DC/DC converter has dropped below a threshold level.

19. The apparatus of claim 11 wherein said at least one sensor includes a plurality of sensors for sensing a plurality of machine operating characteristics and producing a plurality of sensor signals, said apparatus further including:
    a multiplexor for multiplexing the sensor signals produced by said plurality of sensors to produce a multiplexed sensor signal; and
    an analog-to-digital converter for digitizing the multiplexed sensor signal to produce a digital sensor signal which is received and processed by said microcomputer.

20. A monitor that attaches to a machine, said monitor comprising:
    a structural enclosure;
    means for attaching said enclosure to the machine;
    a power source disposed in said enclosure for supplying dc electrical power to the monitor;
    a sensor disposed in said enclosure for sensing an operating characteristic of the machine and producing sensor signals corresponding to the sensed characteristic;
    a microcomputer disposed in said enclosure for receiving and processing the sensor signals to produce sensor data, said microcomputer including a sleep mode for operation at a significantly reduced power level when full power operation is not required;
    memory for storing sensor data; and
    a communications port for communicating with a peripheral device.

21. The monitor of claim 20, further comprising a power switch interconnecting said power source and said sensor and being controllable by said microcomputer to remove electrical power from the sensor when said sensor is not in use.

22. The monitor of claim 20, further comprising:
    a signal conditioning circuit for receiving and processing sensor signals to produce processed sensor signals; and
    a power switch interconnecting said power source and said signal conditioning circuit and being controllable by said microcomputer to remove electrical power from said signal conditioning circuit when the signal conditioning circuit is not in use.

23. The monitor of claim 22, further comprising:
    a frequency filter circuit for filtering the processed sensor signals to remove unwanted frequency components; and
    a second power switch interconnecting said power source and said frequency filter circuit and being controllable by said microcomputer to remove electrical power from said frequency filter circuit when the frequency filter circuit is not in use.

24. The monitor of claim 20 wherein said sensor includes a flux sensor for sensing flux generated by the machine and producing a corresponding flux signal, said monitor further comprising a frequency filter for low-pass filtering the flux signal to remove all frequency components of the flux signal except those in a range from about 0–60 hertz to produce a filtered flux signal, said microcomputer being further operable to transform the filtered flux signal from the time domain to the frequency domain to produce a flux spectrum which includes a first line frequency peak.

25. A method for reducing electrical power consumption in a machine monitor, the method comprising the steps of:
    providing a machine monitor for monitoring an operating characteristic of a machine, said machine monitor comprising:
        a structural enclosure;
        means for attaching said enclosure to the machine;
        at least one sensor disposed in said enclosure for sensing one or more operating characteristics of the machine and producing or signals corresponding to the sensed characteristic;
        monitor electronics for receiving and processing the sensor signals to produce sensor data, said monitor electronics including a microcomputer having a high-power operating mode and a low-power operating mode; and
        a communications port in electrical communication with said microcomputer for communicating with a peripheral device not forming a part of the machine monitor; and
    programming the microcomputer to operate in the low-power operating mode when high-power operation is not needed.

26. The method of claim 25, further comprising the steps of:
    placing the communications port in an operational state by applying electrical power to the communications port;
    placing the microcomputer in the high-power operating mode;
    halting operation of the microcomputer for a predetermined period of time as the microcomputer determines whether a peripheral device is attempting to communicate with the microcomputer; and
    establishing high-power communications between the communications port and a peripheral device when the microcomputer determines that the peripheral device is attempting to communicate with the microcomputer.

27. The method of claim 26, further comprising the step of placing the microcomputer in the low-power operating mode when the microcomputer determines that no peripheral device is attempting to communicate with the microcomputer.

28. The method of claim 25, further comprising the step of turning off a portion of the monitor electronics when said portion of the monitor electronics is not in use.

29. A method for reducing electrical power consumption in a machine monitor, the method comprising the steps of:
providing a machine monitor for monitoring an operating characteristic of a machine, said machine monitor comprising:
a structural enclosure;
means for attaching said enclosure to the machine;
at least one sensor disclosed in said enclosure for sensing one or more operating characteristics of the machine and producing sensor signals corresponding to the sensed characteristic;
monitor electronics for receiving and processing the sensor signals to produce sensor data, said monitor electronics including a microcomputer having a high-power operating mode and a low-power operating mode; and
a communications port in electrical communication with said microcomputer for communicating with a peripheral device not forming a part of the machine monitor; and
a communications port in electrical communication with said microcomputer for communicating with a peripheral device not forming a part of the machine monitor; and
programming the microcomputer to operate in the low-power sleep mode when full power operation is not needed.

30. The method of claim 29, further comprising the steps of:
placing the communications port in an operational state by applying electrical power to the communications port;
placing the microcomputer in the full power operating mode;
halting operation of the microcomputer for a predetermined period of time as the microcomputer determines whether a peripheral device is attempting to communicate with the microcomputer; and
establishing communications between the communications port and a peripheral device when the microcomputer determines that the peripheral device is attempting to communicate with the microcomputer.

31. The method of claim 30, further comprising the step of placing the microcomputer in the low-power sleep mode when the microcomputer determines that no peripheral device is attempting to communicate with the microcomputer.

32. The method of claim 29, further comprising the step of turning off a portion of the monitor electronics when said portion of the monitor electronics is not in use.

33. A method for reducing electrical power consumption in a machine monitor, the method comprising the steps of:
providing a machine monitor for monitoring an operating characteristic of a machine,
said machine monitor comprising:
monitor electronics including a microcomputer having a low-power operating mode and a full power operating mode;
a flux sensor for sensing flux generated by the machine and producing a corresponding flux signal; and
a communications port in electrical communication with said microcomputer for communicating with a peripheral device;
removing all frequency components from the flux signal except those frequency components in a range of about 0 to 60 Hertz, producing a filtered flux signal;
transforming the filtered flux signal to the frequency domain to produce a flux spectrum;
processing the flux spectrum to determine the line frequency at which the first line frequency peak occurs; and
determining the speed of the machine based on the line frequency at which the first line frequency peak occurs.

* * * * *